United States Patent [19]

Brechard et al.

[11] Patent Number: 4,888,778

[45] Date of Patent: Dec. 19, 1989

[54] ALGEBRAIC CODER-DECODER FOR REED SOLOMON AND BCH BLOCK CODES, APPLICABLE TO TELECOMMUNICATIONS

[75] Inventors: Dominique Brechard, Paris; Pierre-Andre Laurent, Bessancourt, both of France

[73] Assignee: Thomson-CSF, Paris, France

[21] Appl. No.: 112,954

[22] Filed: Oct. 27, 1987

[30] Foreign Application Priority Data

Oct. 27, 1986 [FR] France .................. 86 14925

[51] Int. Cl.⁴ ............................................. G06F 11/10
[52] U.S. Cl. ................................................ 371/37.4
[58] Field of Search ..................... 371/37, 38, 39, 40

[56] References Cited

U.S. PATENT DOCUMENTS

| | | | |
|---|---|---|---|
| 3,533,067 | 10/1970 | Zierler et al. | 371/37 |
| 4,142,174 | 2/1979 | Chen | 371/37 |
| 4,162,480 | 7/1979 | Berlekamp | 371/37 |
| 4,360,916 | 11/1982 | Kustedjo | 371/37 |
| 4,637,021 | 1/1987 | Shenton | 371/37 |
| 4,649,541 | 3/1987 | Lahmeyer | 371/37 |
| 4,715,036 | 12/1987 | Oakes | 371/37 |

FOREIGN PATENT DOCUMENTS 0165147 12/1985 European Pat. Off. .
0169908 2/1986 European Pat. Off. .

OTHER PUBLICATIONS

IEEE Transactions on Computers, vol. C-34, No. 8, Aug. 1985, pp. 709–717, "VLSI Architectures for Computing Multiplications and Inverses in $GF(2^m)$".

Proceedings of SPIE—The International Society for Optical Engineering, vol. 421, "Optical Disks Systems and Applications", E. V. LaBudde, Jun. 8-9, 1983, pp. 65–78.

*Primary Examiner*—Jerry Smith
*Assistant Examiner*—Robert W. Beausoliel
*Attorney, Agent, or Firm*—Oblon, Spivak, McClelland, Maier & Neustadt

[57] ABSTRACT

An algebraic coder-decoder for Reed Solomon and BCH block codes is provided, namely a coprocessor of standard microprocessors specialized for algebraic processing in Galois bodies. This processor includes a clock generator which sets the rhythm of the circuit through a cycle clock and a subcycle clock, a control circuit which integrates an automatic loop system and a cycle stealing device, an arithmetic operator for carrying out simple operations on unsigned numbers representing the variables and the parameters of the algorithms a Galois operator for effecting the elementary polynomial operations in the five Galois bodies and storing the data exchanged with the host processor, an interface circuit which integrates a data exchange managment automation, a data bus, an instruction and the connections required for the control signals which connect the four blocks of the device together.

4 Claims, 6 Drawing Sheets

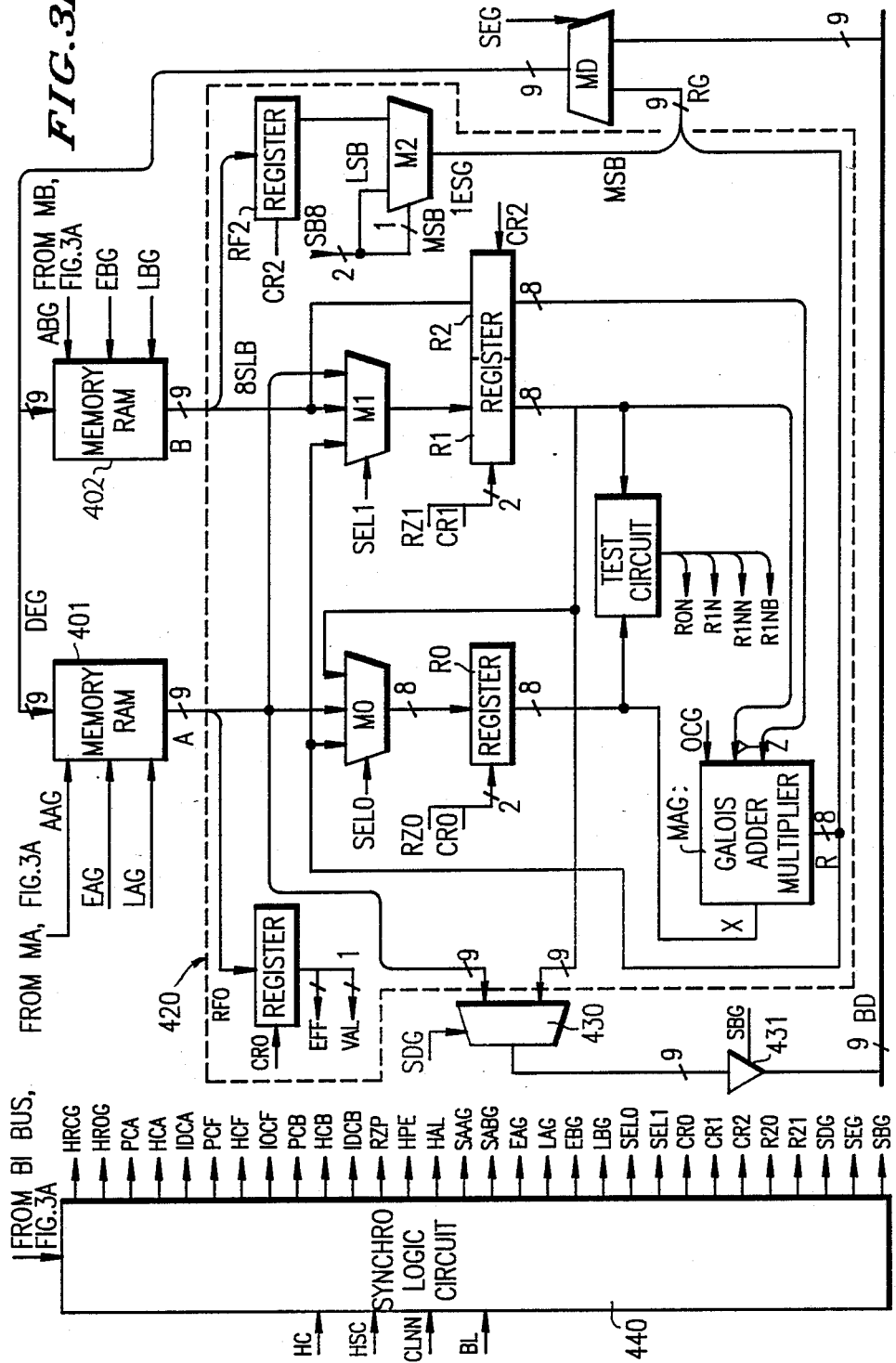

ALGEBRAIC CODER-DECODER FOR REED SOLOMON AND BCH BLOCK CODES, APPLICABLE TO TELECOMMUNICATIONS

BACKGROUND OF THE INVENTION

1. Field of the Invention

The invention relates to the field of digital telecommunications and more particularly to an algebraic coder-decoder circuit for Reed Solomon and BCH block codes, usable in telecommunications.

Digital telecommunications suffer from disturbances due, among other things, to the poor quality of the transmission channel or to the intervention of active jammers. Thus, it is necessary to provide an efficient protection for the information.

2. Description of the Prior Art

The conventional methods associate a simple error, parity, etc detection and a procedure for repeating the messages. These messages may be advantageously replaced by the technique of error correcting codes which provide a good.compromise between the useful flow rate and the safety of the transmitted data. The problem which limits the use of error correcting codes is related to the complexity of their use. In fact, the implementation of this type of code in general or signal processing microprocessors only allows low rate applications. In fact, coding and decoding uses the processing of value polynomials in the Galois bodies to which these conventional processors are badly adapted.

The French patent application No. 84 08141 in the name of the applicant describes a parametrable coder-decoder circuit usable in telecommunications for processing the data by the above mentioned error correcting codes. The coder-decoder described in this application is preferably a monolithic circuit, an intelligent peripheral of a microprocessor which allows flow rates of several tens of kilobits per second to be reached with high error rates in the transmission channel. This standard circuit is capable of processing all the usual codes of the above mentioned code families in their different versions and without any intervention from the host microprocessor other than the definition of the codes used and the control of the input and output operations. However, the coder-decoder circuit described in the referenced application and generally arranged leads to a high level of complexity without however, allowing polynomials to be processed in the Galois body CG (256) which alone is capable of directly processing the bytes i.e. the information in the form in which it is generally presented.

SUMMARY OF THE INVENTION

The invention provides block code coder-decoder improvements with respect to the above described device which provides integration of the circuit in monolithic form, the circuit then being able to reach high performances because more particularly of the simplification of the critical path, of the reduction of the cycle time, and because of the computing power of this specialized circuit.

In accordance with the invention, an algebraic Reed Solomon and BCH block code coder-decoder, applicable to digital telecommunications and designed as a specialized processor, including a clock generator, an arithmetic operator, a Galois operator processing values in Galois bodies, a control circuit and an interface circuit for managing the data transfers with the outside, connected by a data bus, an instruction bus and additional connections, is characterized:

in that the Galois operator includes a computing device with two inputs coupled to the output of two independently addressable memories used as computing memories and also as FIFO memories in connection with the interface circuit, the input-/outputs being executed by a cycle stealing procedure which does not hinder the execution of the computing instructions required for coding decoding, these memories being adapted capacity memories, managed by an indirect memory access automation in the interface circuit, and in that the operator is organized on three levels, a first level for selection of the operand sources useful for the computation, a second level for the storage of three operands X, Y and Z and a third level for carrying out the computation $X+(Y\times Z)$ from the three operands, sufficient for executing general conventional block code coding and decoding algorithms, of the BCH or Reed Solomon type, and in that the control circuit is provided for sequencing the operations by combining an initialization procedure and the execution of loops for repetitions, without test or programmed jump, of the elementary operations required for the polynomial computations.

BRIEF DESCRIPTION OF THE DRAWINGS

The invention will be better understood and other features will be clear from the following description with reference to the accompanying Figures in which:

FIGS. 3A, 3B taken together illustrate a more detailed diagram of the Galois operator, 400, of FIG. 1;

DESCRIPTION OF THE PREFERRED EMBODIMENT

The specialized process for carrying out BCH or Reed Solomon block code coding and decoding includes, like the one described in the above mentioned patent application, an interface circuit for managing the transfers with the host microprocessor, a sequencer circuit which manages the execution of the instructions and the data transfers, a program memory, an arithmetic operator and an operator processing the values in the Galois bodies.

But in accordance with the invention, and as will be described in greater detail hereafter with reference to the accompanying Figs, the sequencer of the device includes an automatic loop system for managing the polynomial algorithms. On the other hand, it does not allow the processing of subprograms which here are superfluous because of the operation of the whole of the coder-decoder circuit. The arithmetic operator, as far as it is concerned, is reduced to what is strictly necessary for ensuring the parametrability of the algorithms and includes RAM, an arithmetic and logic unit ALU and an accumulator. The Galois operator includes two parallel memories driven by a power addressing unit, and a polynomial operator in the Galois bodies optimized so as to provide execution of the polynomial processing required in the most general coding and decoding algorithms by the execution of a microinstruction always similar to itself. Finally, the coder-decoder circuit has an input/output mode whose complex structure, which associates FIFO (first in, first out) controlled memory device, constructed around the two main memories of the circuit and rapid cycle stealing procedure affecting all the functions of the processor, offers a great flexibility of communication with the host processor. This circuit is therefore designed as a specialized peripheral of the host processor with which it is associated.

Figure 1:
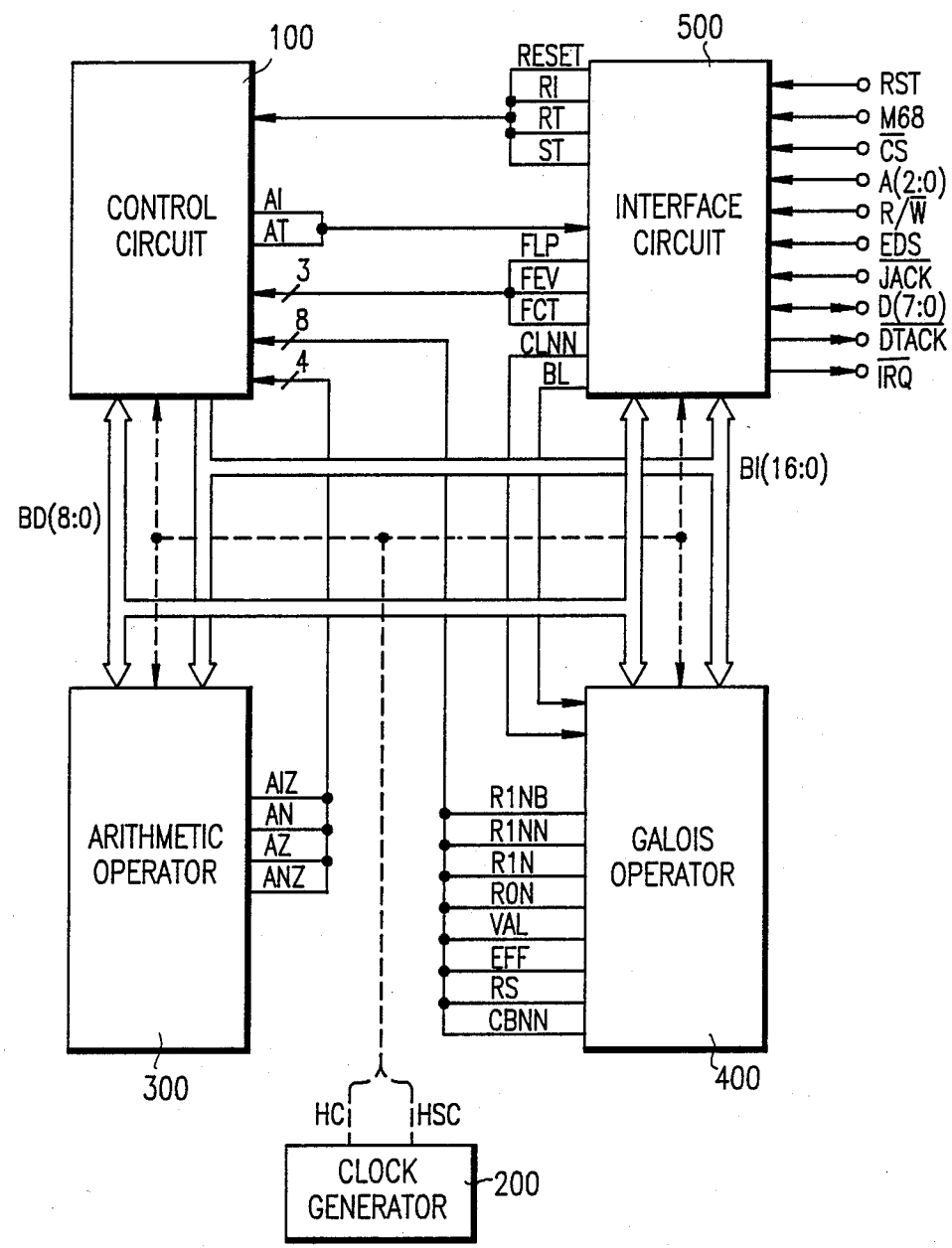
FIG. 1 block diagram of the coder-decoder of the invention.
Figure 6:
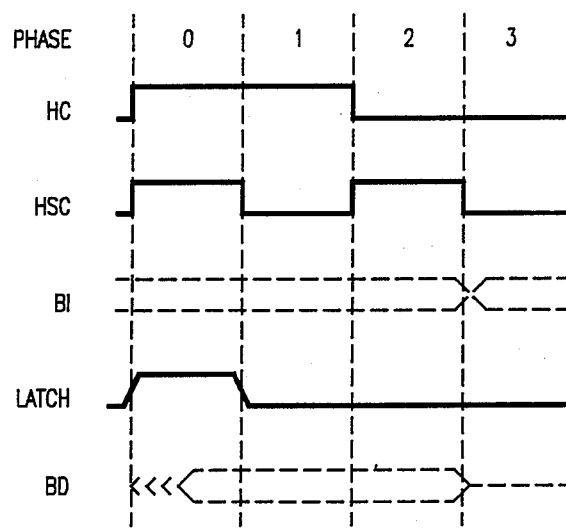
FIGS. 6, 7, 8 and 9 are timing diagrams showing the signals generated respectively in the clock generator 200, in the arithmetic operator 300, in the Galois operator 400 and in the interface circuit 500.

FIG. 1 shows the general block diagram of the specialized processor in the coding and decoding of block codes and includes modules which communicate on the one hand by means of a nine bit data bus BD<8:0>, and on the other by a 17 bit instruction bus, BI<16:0>. These modules are the following:

control circuit 100, which controls the whole of the circuit by means of the instruction bus BI and the interface circuit by means of two signals AI and AT, as a function of the program being executed, of the data present on the data bus BD, of priority signals RI, RT, of conditional test signals (FLP, FEV and FCT) described in greater detail hereafter coming from the interface circuit, of a four bit status word coming from an arithmetic operator and an 8 bit status word coming from the Galois operator;

a clock generator 200, which delivers a cycle clock HC and a "sub-cycle" clock HSC with a period half the clock HC which define four phases per cycle. These two signals shown in FIG. 6 set the timing of the processor operation, an arithmetic operator 300 which processes the arithmetic values required for the algorithms: programming parameters, programming variables, memory addresses... this module is described in greater detail hereafter with reference to FIG. 2; it supplies the four bit status word (AIZ, AN, AZ, ANZ) to the control circuit 100.

a Galois operator 400 which stores the data of the code words and carries out the polynomial operations adapted to the algorithms for processing the codes in the Galois bodies. This module is described in greater detail with reference to FIG. 3; it further supplies the 8 bit status word (R1NB, R1N, RON, VAL, EFF, RS and CBNN) to the control circuit 100, an interface circuit 500 which manages the inputs/outputs with an external processor via an external 8 bit data bus, D<7:0< and external signals to be described hereafter. This circuit is described in greater detail with reference to FIG. 4.

Figure 5:
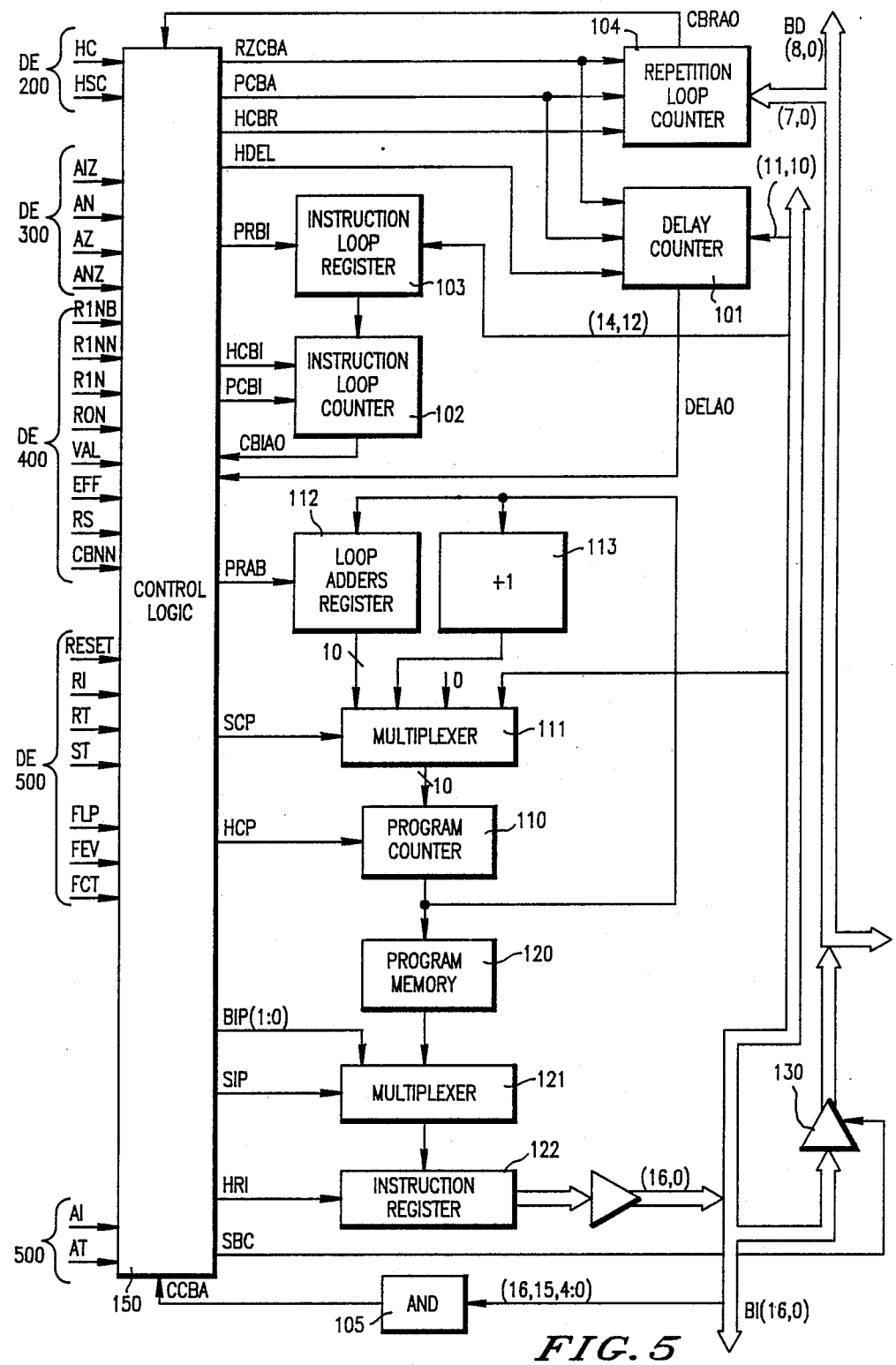
FIG. 5 is a more detailed diagram of the control circuit, 100, of FIG. 1.

The control circuit 100 which controls the assembly is described in greater detail hereafter with reference to FIG. 5.

Figure 2:
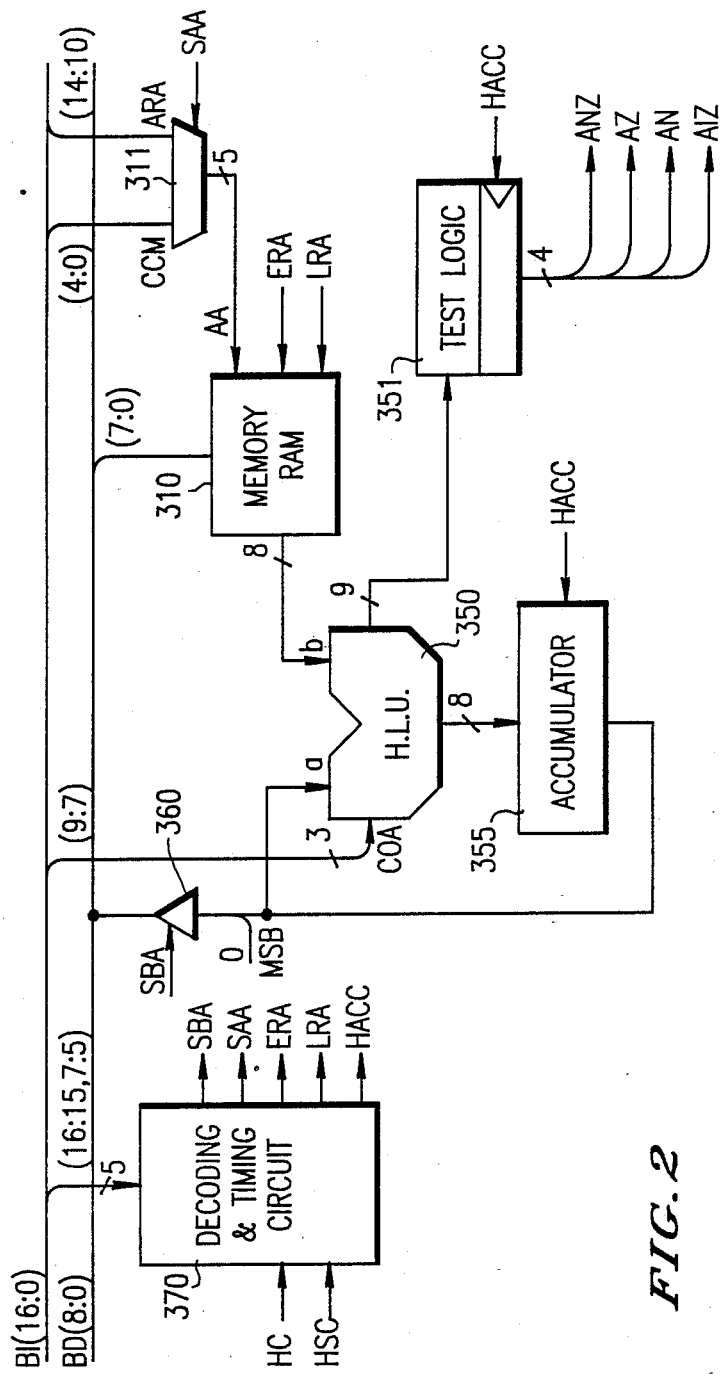
FIG. 2 a more detailed diagram of the arithmetic operator 300, of FIG. 1.

The arithmetic operator 300 of FIG. 1, shown in greater detail in FIG. 2, performs the arithmetic and logic processing on the parameters of the codes, the variables for managing the algorithms and the computed polynomial addresses present in the Galois memories defined hereafter. For exact matching of the processor to such processing, these functions only justify a single operator structure. It includes a low capacity memory 310, an arithmetic and logic unit ALU 350 which performs arithmetic and elementary logic functions on two operands applied to its inputs a and b, and an accumulator register 355 connected to the output of the arithmetic and logic unit 350 which allows a series of simple operations to be accumulated, for example for supplying addresses to the Galois operator or for having available conditional test signals for orientating the sequencing in the control circuit 100. The memory 310 of the arithmetic operator in which the data is stored is an RAM of 32 eight bit words whose address AA comes directly from the instruction carried out by taking it from the instruction bus BI via a multiplexer 311 which chooses as address applied to the input AA of the RAM an instruction field depending on the type of instruction executed (namely in the example shown, the first five bits or the last five bits of the 17 bit word transmitted by the instruction bus BI) on an external control applied to the multiplexer 311 SAA. The data input of this memory is connected to the eight LSB of the data bus BD and its output is connected to a multiple eight bit input, b, of the arithmetic and logic unit. Two control signals ERA and LRA control the writing and reading in this memory.

The simple unsigned operations are carried out by the arithmetic and logic unit 350 depending on the different operation codes defined by a three bit field COA taken from the instruction bus BI and which allows, on the operands a from the accumulator register 355 and b from the RAM 310, the following operations:

the addition without sign $a+b$;
the subtraction without sign $a-b$;
the bit by bit logic AND: a AND b;
the bit by bit logic OR: a OR b;
the operand: b.

The result of the operation is transferred to the accumulator register 355 and to a logic test circuit 351 which, in addition to the eight result bits, receives an additional bit which marks:

the overflow of the positive result for an addition
or the negative result of a subtraction.

The result over 8 bits of the operations is stored in the eight bit accumulator register whose output is connected to the input a of the arithmetic and logic unit as mentioned above, loading into the accumulator being controlled by an accumulator clock HACC. The output of the accumulator may also be carried over the eight LSB of the data bus BD via an output buffer 360 controlled by an activation signal SBA. The MSB is reset to zero.

The logic test circuit 351 which receives the output signal from the arithmetic and logic unit delivers four status signals associated with the result loaded into the accumulator. A first status signal ANZ indicates that the accumulator is not at zero, that is to say that at least one of the nine bits of the result transferred to the accumulator is different from zero; AZ indicates that the accumulator is at zero, that is to say that the nine bits of the output of the arithmetic and logic unit are all zero; AN indicates that the result of the computation in the arithmetic and logic unit is negative, this state being indicated by the 9th bit; AIZ indicates that the result coming from the arithmetic and logic unit is less than or equal to zero and therefore is the active result of the logic operation AZ OU AN. As will be described hereafter, these signals are decoded by a logic circuit of the control circuit at the time of the conditional jump instructions.

Figure 7:
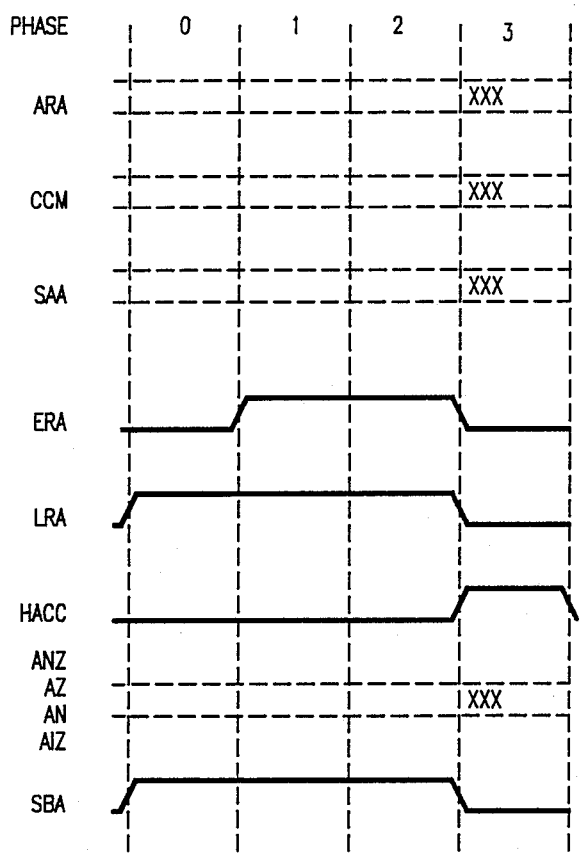

The control instructions for the arithmetic operation contain a field of five bits: <16:15,7:5> in the example shown, decoded by a logic decoding and timing control circuit 370 which further receives the two clock signals HC and HSC. Circuit 370 delivers the signal for selection of the multiplexer 311, SAA, the signals for controlling writing and reading in the RAM 310, ERA and LRA, the clock signal controlling the accumulator HACC and the control signal for activating the output buffer SPA. The timing diagram shown in FIG. 7 shows the timing of the different control signals generated in the arithmetic operator. When the "X"s are mentioned in the timing diagrams, the signals are not established.

Figure 3A:
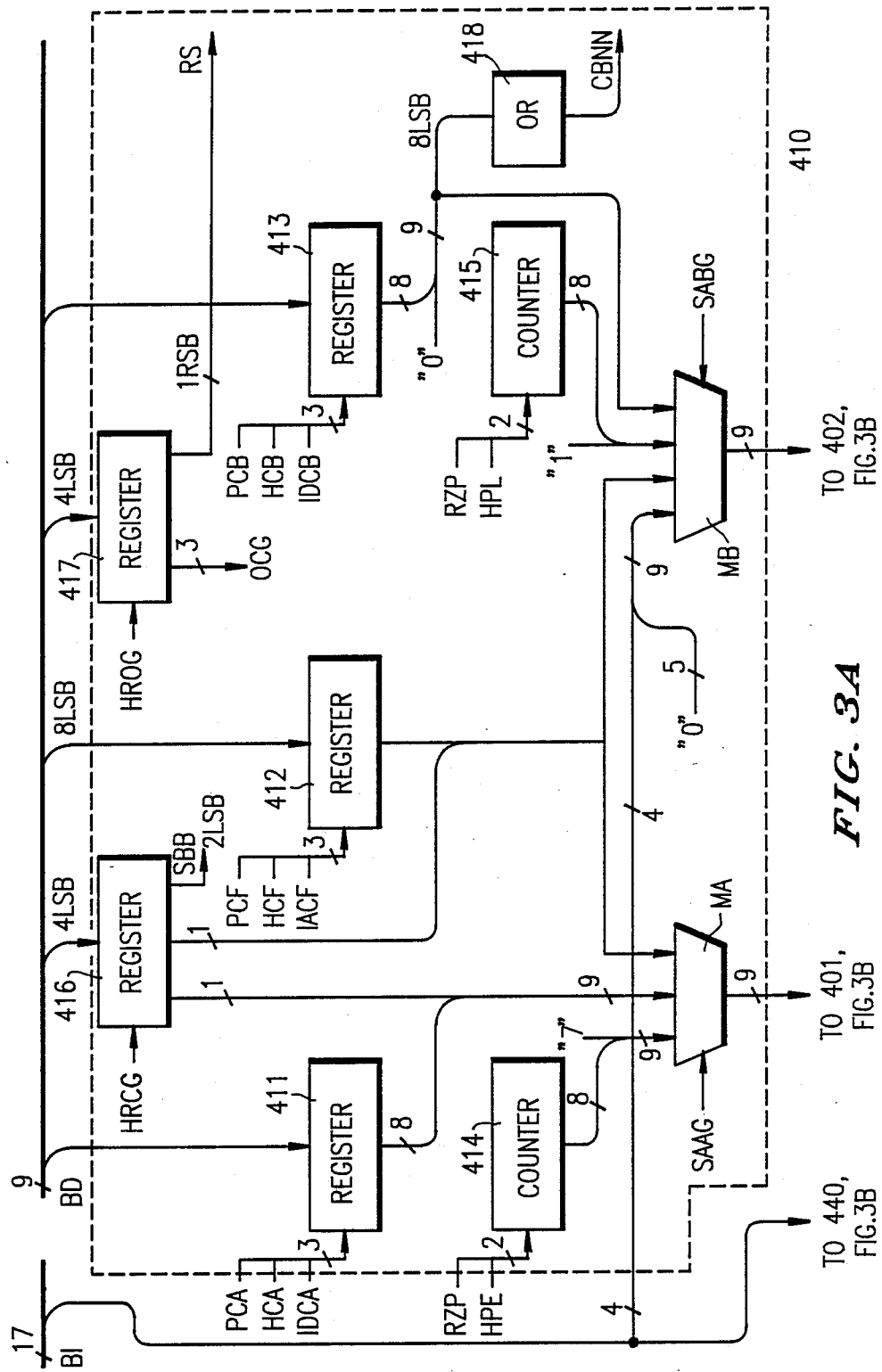

FIGS. 3A and 3B show in greater detail the Galois operator 400 of 1. This operator provides, on the one hand, storage of the data of the code words, of the value computing variables in the Galois body, and further performs the polynomial operations of the coding and decoding algorithms from this data. These functions require a high capacity memory for storing a considerable volume of data (input data, output data, or results of intermediate computation). Generally, the operator is structured in the following way: it includes two memory blocks which allow a double data flow for the single processing of two polynomials or for the double processing of a single polynomial (with simultaneous writing and reading). For that, the memory is driven by an addressing unit providing simultaneous management of the inputs-outputs and of the polynomial computations. These two memory units drive a specialized computing device which performs the basic polynomial operations in a parametrable Galois body: division and development of the polynomial by a mononomial, product of two polynomials, value of a polynomial at a point...

The following description gives one detailed embodiment of the Galois operator: the data is stored in two RAMs, 401 and 402, with capacities equal to 512 words of 9 bits, whose address page 0 to 255, is a computing zone and the other page with addresses 256 to 511 forms the FIFO memory zones for the code words for storing the data exchanged with the outside via the interface. These memories are each controlled by a writing control signal and a reading control signal, EAG, and LAG for memory 401, and EBG and LBG for memory 402. The address inputs AAG and ABG respectively are connected to the outputs of an addressing unit 410. The data input of these memories, common for both, DEG is connected to the output of a multiplexer MD controlled by a selection applied to is selection input SEG, and whose inputs are connected respectively to the data bus BD and to the Galois result output RG of the operator.

The outputs A and B of the two memories, respectively 401 and 402, are connected to the two inputs of the Galois computing device 420.

The addressing unit for memories 402 includes three up-down counters 411, 412 and 413 which generate the addresses of the data required for the polynomial computations, and two counters 414 and 415 generate the addresses of the FIFO for the code word inputs/outputs. The eight bit up-down counters 411, 412 and 413 each receive three control signals:

a signal for preloading the counter PCA, PCB and PCF, respectively,
a signal for controlling the counting direction IDCA, IDCF and IDCB respectively,
a counting control signal HCA, HCF and HCB respectively.

The output of counter 413 is connected to an OR circuit 418 which delivers an active test signal CBNN when the contents of the counter is not zero.

The counters 414 and 415 are eight bit pointers controlled by a common reset signal RZP and by a counting clock, HPE and HPL respectively.

A special type of instruction controls the Galois operator as a whole but some "stable" information requires two permanent registers: a control register 416, driven by four LSB of the data bus, and controlled by a clock HRCG:

the most significant bit RCG <3> controls the page (9th bit) of the address designated by the counter 411.

the next bit RCG<2> fixes the page (9th bit) of the address designated by the counter 412, the last two bits RCG<1.0> form the signal SP8 which controls the selection of the most significant bit of the Galois result RG from the Galois operator, applied to the multiplexer M2 as mentioned below.

A second register 417 fixes the order of the Galois body and is also connected to the four LSB of the data bus to be controlled by a clock HROG. This register determines by its MSB ROG <3> the type of code via the conditional test RS described hereafter;

the other three bits, ROG <2.0> give the order of the Galois body OCG used in the multiplier-adder of the Galois computing device, as described hereafter.

From the above described elements, the addressing mode used in the operator can be explained: the sources of the address AAG of memory 401 are selected by a selection signal SAAG applied to a multiplexer MA between:

counter 411, at the page fixed by register 416;
counter 412, at the page fixed by register 416;
the reading pointer 414, at page 1.

Similarly, the sources of the address ABG of memory 402 are selected by a selection signal SABG applied to a multiplexer MB between:

counter 413, at page 0;
counter 412, at the page fixed by the register 416;
the writing pointer 415 at page 1
or finally a direct four bit address ADB from the instruction bus B1, at page 0.

The computing part of the Galois operator is designed to carry out substantially the whole of the polynomial operations required for coding-decoding by the BCH or Reed Solomon codes using a single type of instruction, the operation performed in the Galois body in the Galois multiplier-adder MAG being always the same. This computing part 420 permits the polynomial operations in the five Galois bodies CG (16) to CG (256). It includes three registers R0, R1, R2 delivering three operands X, Y, Z applied to the multiplier-adder MAG, these operands coming from several possible data sources. For that, register R0 is connected to the output of a multiplexer M0 a first input of which is connected to the output A of the RAM 401, a second input is connected to the output of register R1 and a third input is connected to the result output R of the multiplier-adder. Similarly, regisrter R1 is fed via a multiplexer M1 either by the output B of the RAM 402, or by the output A of the RAM 401 or finally the result output R of the Galois multiplier-adder MAG. For this selection, the multiplexers M0 and M1 are controlled by two selection signals, respectively SEL0 and SEL1. The input of register R2 is connected directly to the output B of the RAM 402. This data is always available over eight bits, the 9th bit of the output words of the RAMs 401 and 402 being respectively applied to two registers RF0 and RF2.

Loading of the registers R0 and RF0 is controlled by a loading control signal CR0, loading of the registers R2 and RF2 is controlled by a loading signal CR2 and loading of register 1 is controlled by the loading signal CR1. Registers R0 and R1 also include a reset input, respectively RZ0 and RZ1. The flip flop RF0 generates two data signals EFF and VAL respectively characteristic of a deletion or on the contrary of validity. Flip flop RF2 has its output connected to the first input of a multiplexer M2 also receiving the two bit selection signal SB8 from register 416. The multiplexer M2 delivers the validity bit assigned to the result R from the Galois multiplier-adder and forming the 9th bit of the Galois result RG at the output of the computing device 420. This device further includes a test logic circuit L0 having two inputs connected to the outputs of registers R0 and R1, this logic circuit delivering status signals depending at each step on these registers R0N if the content of R0 is zero, R1N if the content of R1 is zero, R1NN if the content of R1 is not zero and finally RNB if the content of R1 is non binary. These signals are used in the sequencer as will be described hereafter, during conditional jump instructions.

The cycle clock signals HC and "subcycle" clock signals HSC as well as two control signals CLNN and BL are applied to a synchronization logic circuit 440 which also receives the 17 instruction bits transmitted over the instruction bus BI, at each computing step. This circuit delivers the different control signals applied to the circuits forming the Galois operator for performing the above mentioned operators, that is to say storage of the addressing data in the registers of the addressing unit 410, then transfer of the data required for addressing memories 401 and 402 via the multiplexers of the addressing circuit, the transfer concurrrently of the useful data into the memories, at the addresses supplied by the addressing unit, then computation in the computation device 420 from data coming either from the RAMs 401 and 402, or taken from the output of the computing device itself and transferred to the Galois multiplier-adder via the multiplexers of the computing device and the registers R0, R1 and R2.

For some types of instructions particularly during input/output operations, the data must be transferred as it is over the data bus BD. For that, an additional multiplexer 430 has two multiple inputs connected on the one hand to the output A, over nine bits, of the RA1 401 and, on the other hand, to the eight bit output of register 1, the ninth bit of this input of the multiplexer being positioned at 0. This multiplexer is controlled by a control signal SPG and the output of the multiplexer is connected to the data bus BD via an amplifier forming a buffer stage or output buffer controlled by the signal SBG which validates the transfer of the output data from the multiplexer to the data bus BD.

Figure 8:
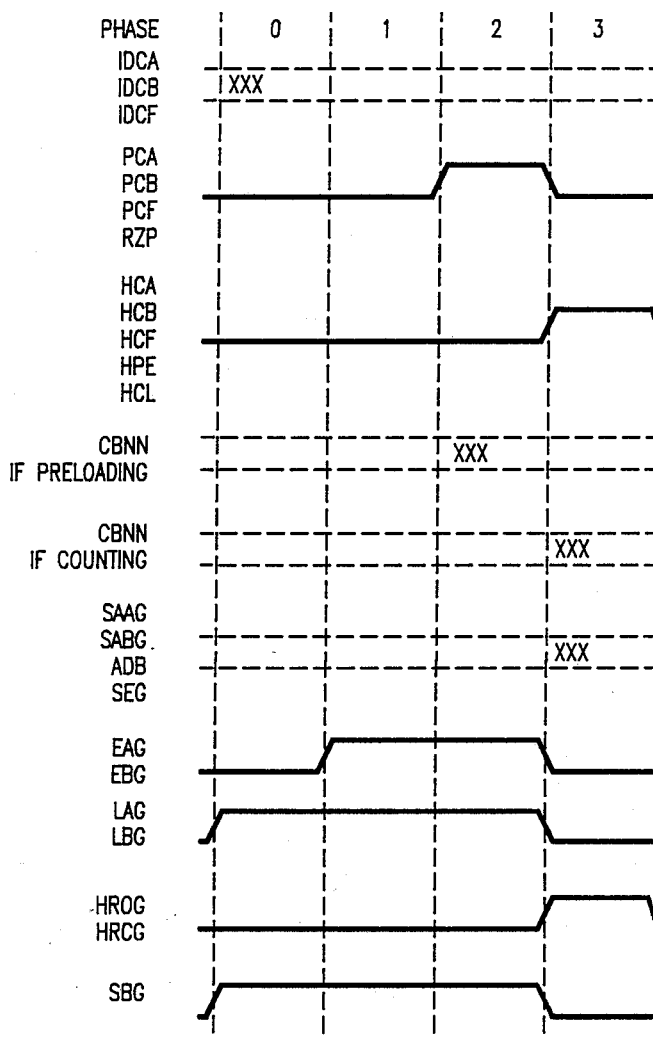

The timing diagram show in FIG. 8 represents the timing of the control signals generated in the Galois operator described above.

Figure 4A:
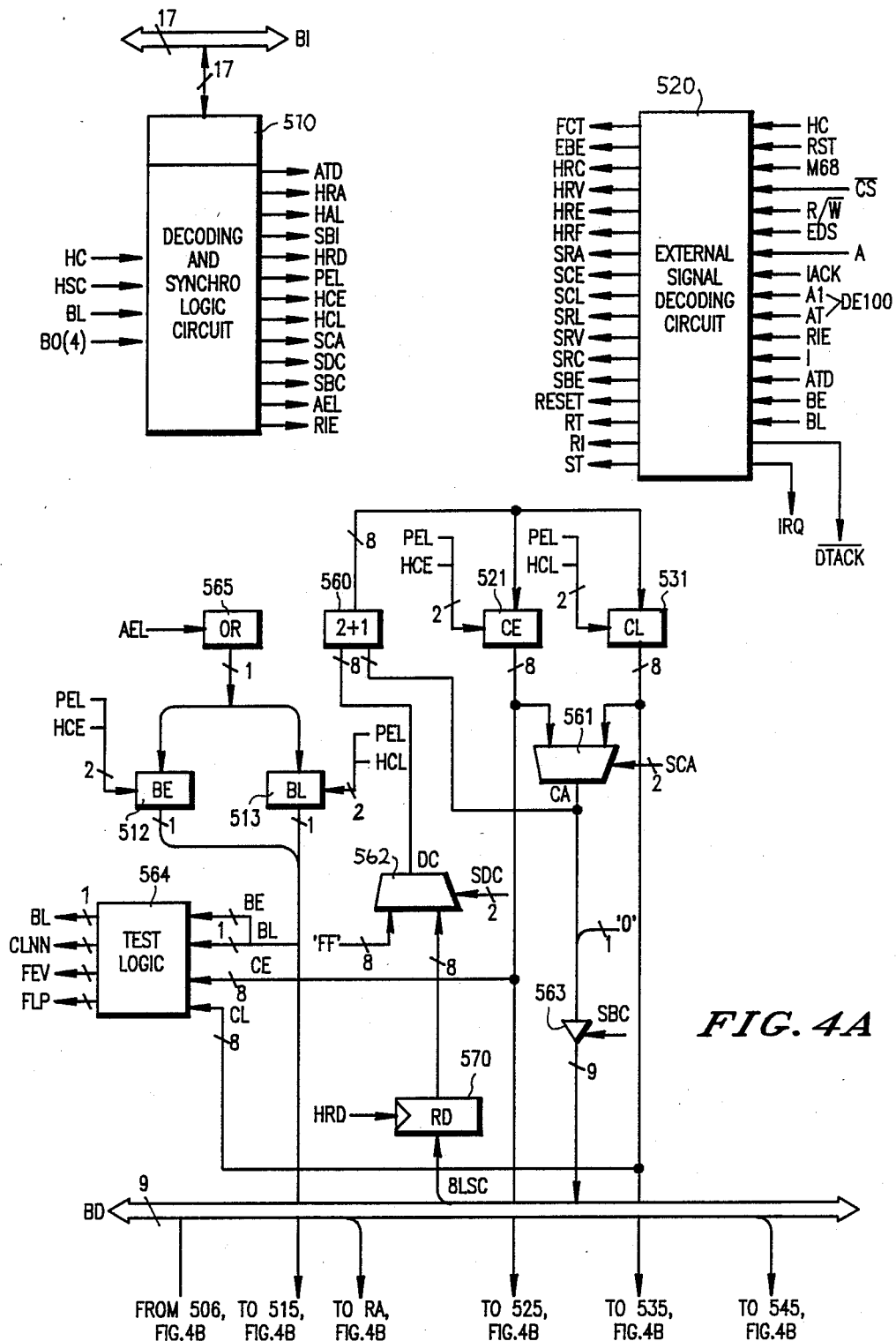
FIGS. 4A, 4B taken together illustrate a more detailed diagram of the interface circuit, 500, of FIG. 1.
Figure 4B:
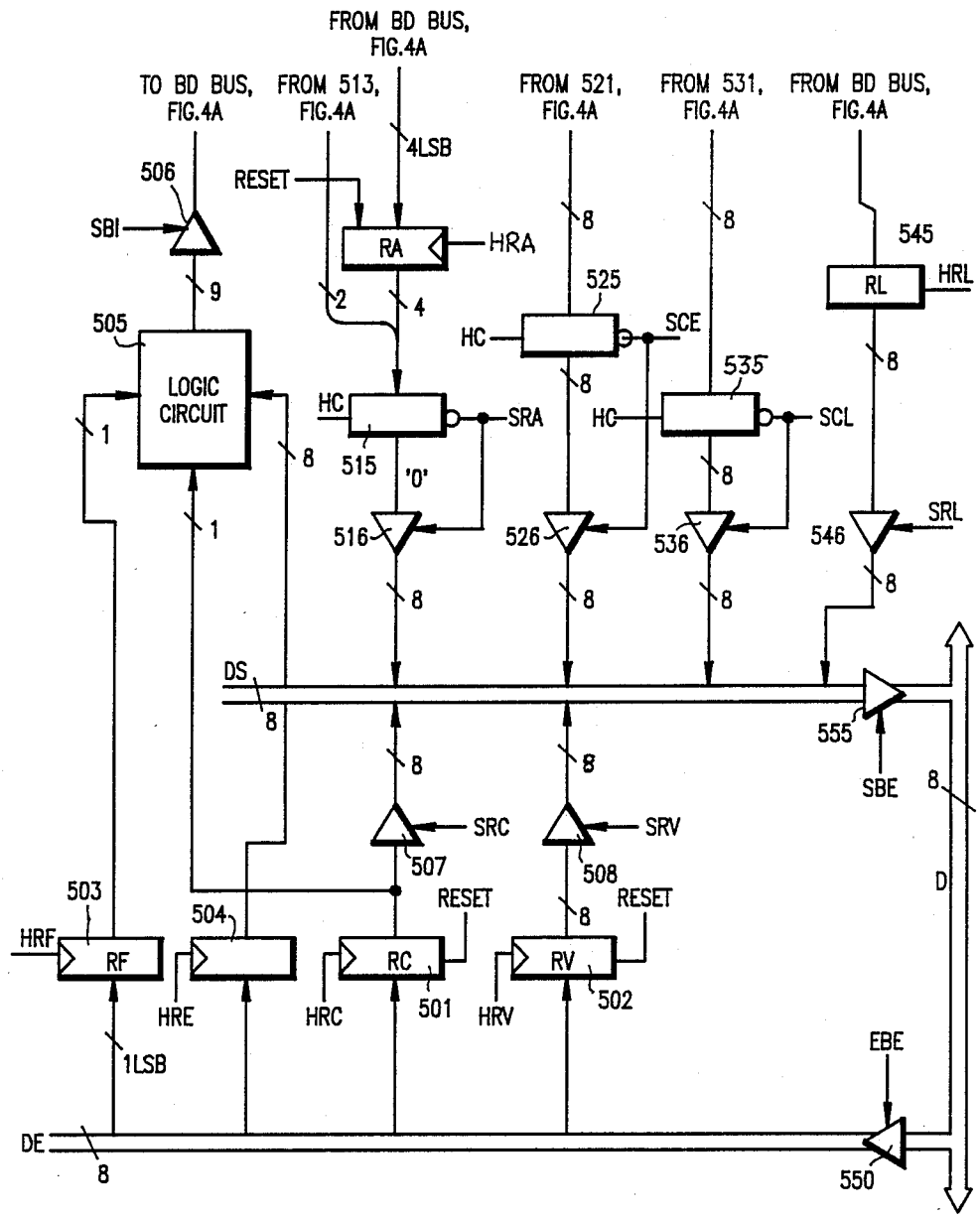

FIGS. 4A and 4B, viewed together is a more detailed diagram of the interface circuit 500 shown in FIG. 1.

The interface circuit includes a decoding and synchronization logic circuit 415 receiving the clock signals and the 17 bits from the internal instruction bus BI and delivering control signals to the interface circuits, and a circuit 520 for decoding the external signals, transmitted by the host processor and used for managing the exchanges. The interface circuit allows the external master processor to access the interface registers which provide the control and knowledge of the status of the coder-decoder via a data bus D through which are also carried out writing of the word symbols to be coded or decoded, or reading of the coded or decoded words by means of the specialized processor. The control signals generated by circuit 520, as a function of the external signals delivered by the external processor, have not been shown in the FIGS. An indirect memory access automation manages the data transfers in both directions with the master processor.

The interface registers deliver their values to a data output bus DS, which data is then loaded on the external bus of interface D via an output buffer 555 controlled by a control signal SBE. For writing, these interface registers store the data present on an internal bus BE received from D via an input buffer 550 and a control signal applied to this buffer EBE is active.

Among the interface registers we have first of all a control register 501 which contains the control word of the circuit. For writing, this register is loaded by the data present on the line DE, on the falling front of the clock HRC which is applied thereto and which immediately activates the interruption request signal R1 and positions the test signal FCT at the true value to signify an interruption reset, these two signals being transmitted to the control circuit 1Q0. During reading, the value contained in this register is delivered over the output bus DS when the control signal SRC applied to an output buffer 507 connected to the output or register 501 is active. The signal RESET resulting from sampling of the external pin RST, controls resetting of register 501 and deactivates the test FCT coming from the external signal decoding circuit 520.

In addition to this control register 501, the interface circuit includes registers for storing a status word: a four bit status register 511 connected to the internal data bus BD and loaded on the instruction by activation of the clock signal HRA, and forced to 0 by the signal RESET, and two one bit status registers 512 and 513, from the indirect memory access automation described hereafter. In addition to the two one bit flip flops 512 and 513, the indirect memory access automation circuit includes two eight bit registers 521 and 531. The information from these different circuits 511, 512, 513, 521 and 531 may be transferred over the output data bus DS, but this information may be modified by the internal program during an external reading cycle. For that, flip flop register 515 associated with registers 512, 513 and 511, 525 associated with register 521 and 535 associated with register 531 are interposed between these registers and the output bus DS. Each of these flip flops loads the value of the real register on the active front of the clock signal HC which is applied thereto, except during an external reading cycle when the corresponding selection bit, respectively SRA, SCE and SCL is active and delivers the value of this flip flop over the output data bus DS. These outputs take place via output buffers, respectively 516, 526, 536.

In addition, an interruption vector register 502 is accessible during direct writing and reading, or during an acquittal cycle. For reading, it is connected to the input data bus DE and loads the corresponding data on the falling front of the clock HRV which is applied thereto. For reading, this register 502 is connected to the output data bus DS via an output buffer 508 controlled by a signal SRV.

The interface circuit further includes a one bit clearance register 503 whose input is connected to the bus DE and whose output is connected to a one bit input of a logic circuit 505. The clearance register is controlled by a clock HRF which controls loading of the LSB of the data present on the bus DE on its falling front.

A data reading register 504 is also connected to the data input DE and for writing loads the 8 bit value present on this bus during the falling front of clock HRE which is applied thereto. The output of this register is connected to a multiple 8 bit input of the logic circuit 505. This circuit 505 has finally a one bit input connected to a one bit output Q of the control register 501. The 9 bit data word transmitted over the data bus BD via the logic circuit 505 and an output buffer 506 on command SPI, includes the 7 LSB of the 8 bit word stored in register 504 and the two MSB depend on the input mode of the data, indicated by the bit Q, of the contents of register 503 and of the values of the MSBs of the data word.

For reading the data present on the data bus BD, the interface circuit further includes a reading register 545 which delivers the data present on the internal bus BD to the output bus VS via output buffer 546 activated by a control signal SRL. This reading register is loaded by activation of the clock HRL which is applied thereto, during instructions which will be defined hereafter.

Reading of the contents of the reading register 545 or writing in the writing register 504 and activation of the transfer request signal RT are only validated if the status bit corresponding to the transfer direction ST is active. For that, the external signal RW is sampled as being the source of the signal of the transfer direction ST. These operations are controlled by a clock signal HRD.

As mentioned above, in addition to the registers assigned to data transfer, the interface circuit includes an indirect memory access automation. This automation counts the number of transfers between the interface data registers 504 and 545 and the internal memories 401 and 402 from an initial state caused by a specific instruction as will be explained hereafter. Two registers 521 and 531 count the number of data accessible for writing or reading respectively when the corresponding status bit from flip flops 512 and 513 respectively is active. These counters 521 and 531 and may be initialized at the maximum value "FF" or moved individually from a value calculated by the program. During an indirect memory addressing instruction, the counter corresponding to the transfer direction is incremented as will be described hereafter. The movements of the counters by the program allow the number of possible transfers to be accumulated, taking into account those which have been carried out and thus facilitate the dialogue between the specialized processor and the external processor, contrary to what usually happens during frozen block exchanges.

The indirect memory access automation includes in addition to counters 521 and 531 and the associated status flip flops 512 and 513, an unsigned 8 bit adder 560 whose output is connected to the input counters 521 and 531. This adder has one input 1 connected to the 8 bit output of a multiplexer 561, this multiplexer having two inputs connected respectively to the outputs of the writing 521 and reading 531 counters, and a control signal input SCA which selects one or other of the outputs of the counters. The second input 2 of adder 561 is connected to the output of a multiplexer 562 controlled by a signal SDC, which has two inputs: one for decrementing the counters by a unit for each "FF" addition and the other coupled to the 8 bit output of a displacement register 570 controlled by a displacement clock HRD, the input of register 570 being connected to the internal data bus BD. Thus, at the input 2 of adder 560, the control SDC selects the value "FF" for effecting a decrementation during an indirect memory access instruction or for adding the contents of the displacement register 570 for a program displacement of the counter. These counters 521 and 531 are two 8 bit registers which load the result of the adder on activation of the clocks respectively HCE and HCL, and which may be initialized at the maximum value "FF3 by the preload command PEL which is applied thereto. As mentioned above with each counter is associated a validity bit stored in the flip flops 512 and 513 on the command HCE and HCL, and which may be reset by the command PEL which is also applied thereto. The validity bit applied to these registers 512 and 513 is either the carry from the adder 560 during a decrementation, or the value 1, through a control signal AEL, these two signals being applied to the inputs of an OR gate 565 whose output is connected to the inputs of registers 512 and 513.

Reading of the contents of one of the counters 521 or 531 on the internal data bus BD is achieved by activating the command SPC applied to the output buffer 563 connected to the output of the multiplexer 561. The cycle stealing procedure provides complete control of the indirect memory access automaton, by means of the instruction bus BI, for simplifying the control structure of the circuit.

Furthermore, a test logic circuit 564 receives the writing and reading validity bits at the outputs of registers 512 and 513 and the contents of the writing and reading counters 521 and 531 and defines, from these signals, test signals for controlling the memories and managing the sequencer:

FEV which indicates that the writing memory is empty when the validity bit from flip flop 512 is equal to 1 and when the contents of the writing counter is at maximum;

FLP which indicates that the reading memory is full, that is to say which is validated when flip flop 513 is at 1 and when the content of the reading counter 531 is at maximum.

The logic test circuit 564 transmits the reading validity bit from register 513 as it is and a signal indicating that the reading counter 531 has a non zero content, CLNN.

Figure 9:
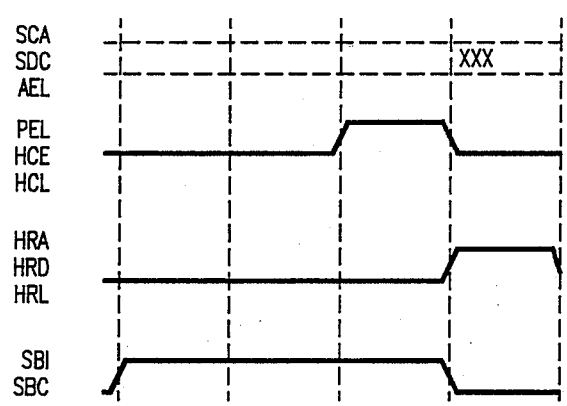

FIG. 9 is a timing diagram of the above described control signals generated in the interface circuit.

The control circuit shown in FIG. 5 integrates the sequencer of the specialized processor and manages the whole of the coder-decoder.

In addition to the conventional modes of a sequencer, conditional jump etc..., the sequencer of the specialized processor includes in particular an automatic loop system, adapted particularly to the polynomial algorithms, and whose operation is "transparent" from the end of an initialization instruction. This procedure allows a loop of p instructions (p less than or equal to 16) to be described n times (n being less than or equal to 256) after a delay of m instructions (m less than or equal to 8), while only "losing" a single initialization instruction.

This control circuit receives clock signals HC and HSC from the clock generator 200, the test signals from the arithmetic operator 300 and from the Galois operator 400 and control signals from the interface 500. These signals are applied to a control logic circuit 150 which generates logic control signals intended for the other circuits of the control circuit. This circuit further includes an assembly for managing the automatic loop which comprises:

a three bit delay counter 101 which counts down the instructions before the first instruction of the body of the loop. This counter receives the two of rank bits 10 and 11 from the instruction bus, a counting clock HDEL and two control signals, one a reset signal RZCBA and the other a preload signal PCBA. This counter delivers an output signal DELAO applied to the control logic circuit when its content is zero, an instruction loop counter 102 which receives an instruction loop counting clock HCBI and a signal for preloading the instruction loop counter PCBI coming from the control logic circuit, and the content of an instruction loop register 103 controlled by a three bit instruction field coming from the instruction bus BDI, <14:12>, and controlled by a preload signal PRBI coming from the control logic circuit. Thus the instruction loop counter 102 counts down the instructions of the loop body and is automatically reloaded at the end of the loop body with the value of the instruction loop register 103 which stores the length of the loop body, an 8 bit repetition loop counter 104 which counts down the number of times that the loop body is to be executed and which receives 8 bits from the data bus BD, a reset signal RZCBA coming from a control logic circuit, a preload circuit PCBA and a repetition loop counting clock HCBR, all three coming from the control logic circuit. This counter sends a control signal to the logic circuit 150 when its content is zero, CBRAO. When the loop counter 104 is initialized at zero the loop is formed a single time.

The instruction for initializing the automatic loop loads counters 101 and 102 with a value from the instruction, and counter 104 with the 8 LSB of the data bus BD which then has the value of the accumulator 355 of the arithmetic operator; the signal for loading the automatic loop counter CCBA coming from an AND gate 105 to which the instruction field BI<16,15,4:0> is applied, is then active.

The control circuit further includes a ten bit program counter 110 which presents the address of the next instruction. For that, this ten bit counter has its input connected via a multiplexer 111 to the output of a loop address register 112 which presents the automatic loop beginning address. The multiplexer also receives an address called immediate address, present over ten of the bits of the instruction bus, BI<14:5>. This program counter 110 may also be reset via a reset input of the multiplexer and may also undergo an iteration by means of an adder receiving the content of the program counter 110 to which it adds 1, the output of this adder 113 being connected to a fourth input of the multiplexer 111. The input of the loop address register 112 is also connected to the output of the program counter 110. The program counter 110 receives a clock signal HCP from the control logic circuit 150; the multiplexer 111 receives a control signal SP also coming from the control logic circuit 150; and the loop address register 112 receives a loading control signal PRAB coming from this same circuit.

Finally, the control circuit also includes a unit for managing the instruction bus which includes:

a program memory 120, ROM, having a capacity of 1024 17 bit words connected to the output of the program counter CP and whose output is connected to the input of an instruction register 120 via a multiplexer 121. The instruction register 122 presents the instruction to be executed, on the instruction bus, via an output buffer 123. During program sequencing, the instruction register 122 loads the value from the program memory 120 but a priority instruction may take its place, on a command SIP coming from the control logic circuit, in certain cases.

The control logic circuit generates an acquittal signal AT and a signal AI intended for the interface circuit 500. Finally, a transfer of data from the instruction bus BI to the data bus BD may be carried out on a command SBC coming from the control logic circuit via an output buffer 130.

The architecture of the algebraic coder-decoder described above allows the operation to be optimized for the coding and decoding of block codes. The following description of certain special points concerning the internal operation of this coder-decoder will bring out these advantages.

It was mentioned above that this coder-decoder permitted internal interruptions and data transfers by indirect memory access:

An internal interruption is activated whenever the management processor sends a control word to the control register 501 of the interface circuit. Resetting of the sequencer alone diverts the program to address hOO. This mechanism allows the information to be kept and which is useful for the following processing which is present in the different memories of the circuit.

Insofar as the transfer of data by indirect memory access is concerned, each access to one of the writing or reading interface registers 504 and 545 generates a transfer request, that is to say the activation of the signal RT by the interface module. This request, validated by the bit coming from register 512 or from register 513 respectively for writing or reading depending on the transfer direction designated by the signal ST, is activated by the interface circuit and transmitted to the control module which acquits it by the signal AT the end of the instruction being executed.

Thus the control logic circuit 150 is activated by the signals RT and ST for "stealing" as rapidly as possible a cycle or program being executed which forces a priority instruction of the indirect memory access type (AMI). Depending on the transfer direction ST, this particular instruction provides:

1° An indirect memory access for writing (AMIE) namely:
   the transfer of the data present in the writing register 504 to memory 402, at the address indicated by the writing pointer 415;
   post incrementation of the writing point 415,
   post decrementation of the writing counter 521 of the interface circuit.

2° An indirect memory access for reading (AMIL) namely:

the transfer of the data present in memory 401 to the address indicated by the reading pointer 414 in the reading register 545;

post incrementation of the reading pointer 414, if and only if the content of the reading counter 531 is different from 0 (the reading pipe line stage requires such checking of the reading pointer 414 so as not to lose a data when the FIFO memory is empty after this last transfer);

post decrementation of the reading counter 531.

As indicated above, the block code coder-decoder which has just been described is a specialized processor which- integrates a wired operator performing the multiplication addition in five Galois bodies, from CG (16) to CG (256). With this structure the most usual coding and decoding algorithms can be used, except for those which use logarithmic processing or inverse functions for which this, processor is not optimized, the computation of the inverse or of the logarithm of an element requiring at most a loop of the size of the Galois body. But simple modifications to conventional algorithms allow this type of computation to be avoided. The main coding and decoding algorithms for the BCH and Reed Solomon codes are described in the following documents:

"Error Correcting Codes" by PETERSON and WELDON (MJT Press 1972),

"Algebraic Coding Theory" by BERKLEKAMP, Mc Graw Hill, 1968.

These algorithms use elementary polynomial functions such as the division or the multiplication of polynomials by a monomial of type $(1 + az)$ or $(a + z)$ and the calculation of the product coefficients of two polynomials, which are readily implanted in this processor through the automatic loop of the sequencer and in the data path optimized in the Galois operator. These different algorithms are implemented in a program memory 120 following a microcode defined for this processor. This microcode includes in the example described four types of instructions which are differentiated by the MSBs, any instruction being as described above coded over 17 bits, $BI<16:0>$. The typical two bit field $<16,15>$ determines the distribution of the other fields of the instruction. By way of example, these instructions may be the following:

type 1: immediate value instruction:

this instruction performs one of the following actions:

(a) loading of an immediate value of 8 bits, VIM defined by the field $<6:14>$ of the instruction, in the RAM 310 of the arithmetic operator, at the address of the field CCM defined by the five LSBs of the instruction $<4:0>$.

(b) loading of an immediate value of 9 bits: $<14:6>$ at an address defined by the field CCM $<4:0>$ of the instruction.

(c) the instruction for initializing the indirect memory access corresponding to a specific code CCM; this operation cancels out the writing and reading pointers 414 and 415 and initializes the counters of the indirect memory access automaton 512, 513 and 521, 531.

type 2: arithmetic operator instruction: this instruction performs one of the following actions:

(a) an arithmetic operation between the contents of the accumulator 355 and the value from the memory 310 of the arithmetic operator 310, at the address ARA given by the bits $<14:10>$ of the corresponding instruction, with transfer or not of the prior value contained in the accumulator 355 to an address fixed by the field CCM, BI $<4:0>$.

(b) the transfer of a value coming either from one of the sources of the data bus BD selected by the field CCM of the instruction, into the memory 310 of the arithmetic operator at the address ARA determined by the field $BI<4:10>$.

(c) a counter displacement instruction:

the displacement of the writing counter 521: this instruction performs the addition of the contents of the displacement register 570 with the contents of the writing counter 521 and activates the writing bit coming from the flip flop 512.

displacement of the reading counter 531: this instruction performs the addition of the contents of the displacement register 570 with the contents of the reading counter 531 and activates the reading bit coming from flip flop 513. If the reading bit is inactive this instruction reactivates the reading indirect memory access by loading the reading register 545 with the data present in memory 401 at the address of the associated reading pointer 414, which is then post incremented.

(d) initialization of the three automatic loop counters of the sequencer 101, 102 and 104, the values transmitted to counters 101 and 102 coming from the field microinstruction $<11:10>$ and $<14:12>$ respectively, whereas that loaded into counter 104 is supplied by the accumulator 355 of the arithmetic operator via the data bus $BD<7:0>$.

type 3: Galois operation instruction: this instruction controls the Galois operator 400, namely (a) writing or reading in memories 401 and 402.

(b) addressing these memories and modification of the address counters, (c) selection of the operands and control of the registers R0, R1, R2 of the Galois computing device 420.

type 4: jump instruction: this instruction performs the conditional jump of the program depending on the value of one of the sixteen conditional tests carried out on the test word of the arithmetic operator (4 bits), the test word of the Galois operator (8 bits), the three test bits of the interface (FLP, FEP and FCT) and a 16th bit when a condition is always true.

For indirect memory access, instructions of type 1, arithmetic operation instruction, perform the data transfers.

For writing indirect memory access, the instruction provides the following actions:

(a) transfer of the data from register 504 to memory 402 at the address given by the writing pointer 415;

(b) post incrementation of the pointer 415;

(c) post decrementation of the writing counter 521.;

For reading indirect memory access, the instruction provides the following actions:

(a) transfer of the contents of memory 401 to the address of the reading pointer 414 in the reading register 545;

(b) post incrementation of the reading pointer 414 if and only if the content of the reading counter 531 is different from 0. This check is necessary so as not to lose a data when the FIFO reading part of memory 401 is empty;

(c) post decrementation of the counter 531.

Precise writing of the required instruction is within the scope of a man skilled in the art and will therefore not be described in detail here.

Furthermore, the host processor may check the status of the peripheral by transparent reading of the status word.

The principles of data exchange in the coder-decoder free the host processor from any constraint other than the time for the tasks specific to processing of the codes. Which is possible because of the structure of the internal memories of circuit 401 and 402 in two memory portions of 256 words one devoted to writing new data, the other to the reading of processed data which is not directly addressed by the host processor, but supplied and emptied through two writing and reading interface registers 504 and 545.

As explained above, these registers allow the host processor to carry out transparent data exchanges for the peripheral thanks to the internal cycle stealing procedure. Thus, after any writing of data by the host processor, a cycle is stolen so as to transfer this data from the writing register to the memory. During reading, the operation is identical except that the transfer between the memory and the reading register prepares the data of the next exchange (reading pipe line).

This device allows the tasks of the host processor and of the coder-decoder to be desynchronized and limits the data exchange protocol to the simple knowledge of the status of the memories. For this, the status word indicates if each of the memories is accessible, and the two counters 521 and 531 give the number of data which may be exchanged during reading and writing.

The maximum frequency of the clock of the coder-decoder, 10MHz, allows useful rates to be reached between 100 and 200 kbits/S for codes of redundancy 2. The memory capacity is sufficient for processing such Reed Solomon type codes with a symbol size of 4 to 8 bits and BCH type codes up to a length of 255 bits.

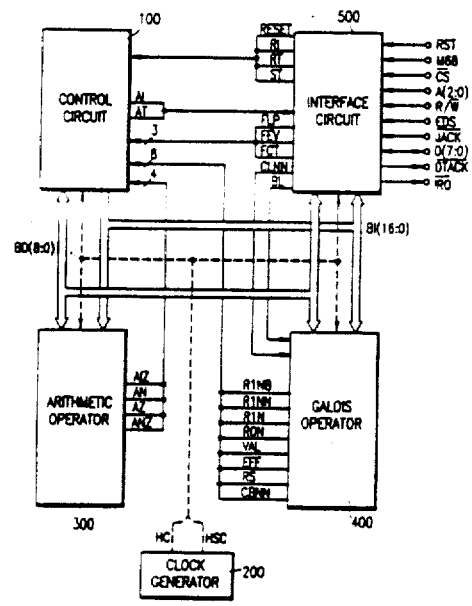

What is claimed is:

1. An algebraic Reed Solomon and BCH block code coder-decoder comprising:

a processor means;

a clock generator coupled to said processor means;

an arithmetic operator means coupled to said processor means;

a Galois operator coupled to said processor means for processing values in Galois bodies having a computation means having two inputs;

two independent addressable memories of matched capacities coupled to the inputs of said computation means;

an indirect memory access means operatively associated with said Galois operator for controlling access to said two memories;

an operator circuit control means organized on three levels, the first level being for the selection of data sources, the second for the storage of three operands X, Y and Z;

and the third for computation of $X+(Y \times Z)$ from said stored operands and for executing block code coding and decoding algorithms;

a control and interface circuit contained as part of said processor means and having I/O access and connected to a data bus for controlling access to said I/O and for executing a sequence of operations including initialization of said access and polynomial computations;

wherein said two independent memories coupled to computation means are used as FIFO memories for said control and interface circuit on a cycle stealing arrangement.

2. The coder-decoder as claimed in claim 1, wherein said arithmetic operator means is comprised of:

one memory, an arithmetic and logic unit wherein a first input of which is connected to the output of the memory and the other input of which is connected directly to the output of an accumulator also connected to the data bus and the input of which is connected to the output of the arithmetic unit, addressing of the memory and the control of operations in the arithmetic and logic unit being carried out directly by the instruction bus.

3. The coder-decoder as claimed in claim 2, wherein the two memories of the Galois operator are each separated into two memory pages, one used as FIFO for the data inputs/outputs, and the other reserved for computation and more particularly for storing intermediate values.

4. The coder-decoder as claimed in claim 3, wherein the input/output access, via the control and interface circuit are dynamically allocated as a function of the data to be read for transmission to outside, or to be written for processing inside the circuit; and means for controlling the indirect memory access of the interface circuit which includes a writing counter register and a reading counter register associated respectively with the memory zones reserved respectively for writing and reading of the data.

* * * * *

UNITED STATES PATENT AND TRADEMARK OFFICE
CERTIFICATE OF CORRECTION

PATENT NO.   : 4,888,778　　　　　　　　　　　　　Page 1 of 2

DATED        : DECEMBER 19, 1989

INVENTOR(S)  : DOMINIQUE BRECHARD ET AL.

It is certified that error appears in the above-identified patent and that said Letters Patent is hereby corrected as shown below:

The Title Page:

The title page showing the number of drawing sheets should be deleted and substituted therefore the attached title page.

Signed and Sealed this

Thirty-first Day of December, 1991

Attest:

HARRY F. MANBECK, JR.

*Attesting Officer*　　　　　*Commissioner of Patents and Trademarks*

United States Patent [19]

Brechard et al.

[11] Patent Number: 4,888,778
[45] Date of Patent: Dec. 19, 1989

[54] ALGEBRAIC CODER-DECODER FOR REED SOLOMON AND BCH BLOCK CODES, APPLICABLE TO TELECOMMUNICATIONS

[75] Inventors: Dominique Brechard, Paris; Pierre-Andre Laurent, Bessancourt, both of France

[73] Assignee: Thomson-CSF, Paris, France

[21] Appl. No.: 112,954

[22] Filed: Oct. 27, 1987

[30] Foreign Application Priority Data

Oct. 27, 1986 [FR] France ............... 86 14925

[51] Int. Cl.⁴ .................................. G06F 11/10
[52] U.S. Cl. ...................................... 371/37.4
[58] Field of Search ............... 371/37, 38, 39, 40

[56] References Cited

U.S. PATENT DOCUMENTS

| | | | |
|---|---|---|---|
| 3,533,067 | 10/1970 | Zierler et al. | 371/37 |
| 4,142,174 | 2/1979 | Chen | 371/37 |
| 4,162,480 | 7/1979 | Berlekamp | 371/37 |
| 4,360,916 | 11/1982 | Kustedjo | 371/37 |
| 4,637,021 | 1/1987 | Shenton | 371/37 |
| 4,649,541 | 3/1987 | Lahmeyer | 371/37 |
| 4,715,036 | 12/1987 | Oakes | 371/37 |

FOREIGN PATENT DOCUMENTS

0165147 12/1985 European Pat. Off.
0169908 2/1986 European Pat. Off.

OTHER PUBLICATIONS

IEEE Transactions on Computers, vol. C-34, No. 8, Aug. 1985, pp. 709-717, "VLSI Architectures for Computing Multiplications and Inverses in GF($2^m$)".
Proceedings of SPIE—The International Society for Optical Engineering, vol. 421, "Optical Disks Systems and Applications", E. V. LaBudde, Jun. 8-9, 1983, pp. 65-78.

*Primary Examiner*—Jerry Smith
*Assistant Examiner*—Robert W. Beausoliel
*Attorney, Agent, or Firm*—Oblon, Spivak, McClelland, Maier & Neustadt

[57] ABSTRACT

An algebraic coder-decoder for Reed Solomon and BCH block codes is provided, namely a coprocessor of standard microprocessors specialized for algebraic processing in Galois bodies. This processor includes a clock generator which sets the rhythm of the circuit through a cycle clock and a subcycle clock, a control circuit which integrates an automatic loop system and a cycle stealing device, an arithmetic operator for carrying out simple operations on unsigned numbers representing the variables and the parameters of the algorithms a Galois operator for effecting the elementary polynomial operations in the five Galois bodies and storing the data exchanged with the host processor, an interface circuit which integrates a data exchange managament automation, a data bus, an instruction and the connections required for the control signals which connect the four blocks of the device together.

4 Claims, 9 Drawing Sheets